United States Patent [19]
Haque

[11] Patent Number: 4,801,888
[45] Date of Patent: Jan. 31, 1989

[54] PROGRAMMABLE, UNIVERSAL FILTER WITH SELF BIASING

[75] Inventor: Yusuf A. Haque, San Jose, Calif.

[73] Assignee: Maxim Integrated Products, Sunnyvale, Calif.

[21] Appl. No.: 161,996

[22] Filed: Feb. 29, 1988

[51] Int. Cl.$^4$ .............................................. H03F 1/34
[52] U.S. Cl. ........................................ 330/9; 330/107; 333/173
[58] Field of Search ..................... 330/9, 51, 107, 109, 330/294; 307/520; 328/167; 333/173

[56] References Cited

PUBLICATIONS

Allsot et al, "An Electrically-Programmable Switched Capacitor Filter," *IEEE Journal of Solid-State Circuits*, vol. SC-14, No. 6, Dec. 1979, pp. 1034–1041.
Foxall et al, "A Switched Capacitor Bandsplit Filter Using Double Polysilicon Oxide Isolated CMOS", 1980 *IEEE International Solid-State Circuits Conference*, Feb. 13, 1980, pp. 90, 91, 264.

*Primary Examiner*—James B. Mullins
*Attorney, Agent, or Firm*—Blakely, Sokoloff, Taylor & Zafman

[57] ABSTRACT

The invention relates to a self-biasing, programmable, universal active filter having an input section which includes an operational amplifier. The amplifier has one output and two input terminals. A first capacitor has one of its terminals coupled to a first of the input terminals of the amplifier and the other terminal serving as an input node to the filter. The second capacitor is coupled between the same input terminal and the output terminal. The filter has a bandpass section having an output and an input coupled to the output terminal of the amplifier. The filter has a low pass section having an output and an input coupled to the output of the bandpass section. The filter has a third capacitor coupled between the first input terminal of the amplifier and the output of the bandpass section. Finally, the filter uses a pair of switched capacitors under clock control, one in parallel with the first capacitor and the other in parallel with the second capacitor, whereby DC current can flow from the input terminal of the filter to first input terminal of the amplifier, and from the same one input terminal of the amplifier to the output terminal of the amplifier during at least a portion of the clock cycle.

7 Claims, 1 Drawing Sheet

PROGRAMMABLE, UNIVERSAL FILTER WITH SELF BIASING

BACKGROUND OF THE INVENTION

A universal, programmable active filter on a single silicon chip is an active filter which, by switchable programming through switches or with controllers or a microcomputer, or by application of control voltages to appropriate pins of the integrated circuit the filter may be programmed. The control signals are decoded on chip and applied to MOS devices operated as switches. This programming can be used to change the filter from one type of output such as a bandpass, to another type, such as allpass, lowpass, highpass or notch. Not only may the type of output of the filter be changed by software, but the filter's selectivity "Q", its gain, its center frequency (or cutoff frequency), and other parameters also may be changed. By the proper application of on and off signals to the gates of these MOS devices, capacitors and/or resistors may be switched in and out of the filter circuit, all as well known in the art. Therefore, resistor or capacitor values (or the parameters of a resistor/capacitor pair) may be varied using a microprocessor program which limits control pulses to these MOS gates.

Universal, programmable active filters are well known. Most employ an operational amplifier. Since the potential difference between the two input nodes of an operational amplifier must be close to zero volts, some form of feedback loop is necessary from the output to the negative input. A parallel-coupled resistor can serve this purpose. It allows the flow of d.c. current from the inverting input of the operational amplifier to the output. However, resistors are difficult to integrate on a single silicon chip in a manner where they can be programmed into and out of the circuit using MOS switches. Once the resistors are formed on the circuit, they have a fixed resistance. Switching resistors in and out using MOS switches causes distortions caused by resistor nonlinearities and inaccuracies in resistance values because the MOS devices themselves introduce unwanted cumulative resistance values which are difficult to control. To avoid this problem, prior art filters, for example the commercially available MF 10 programmable filter, uses external resistors rather than on-chip resistors.

However, it is highly preferable for ease of use to have all necessary components directly on the chip. One way for providing the necessary feedback entirely on the chip without resistors would be to substitute capacitors which are easier to fabricate in a small area in an integrated circuit design. Capacitors can accurately be switched in and out of the circuit using MOS switches. However, using a parallel-coupled capacitor instead of a resistor does not permit d.c. current to flow between the input and the output terminals of the amplifier. This prevents the inverting input node from periodically being brought back to the d.c. offset voltage of the operational amplifier, as required.

One compromise technique which has been used is the provision of an additional large resistor in parallel with the capacitor coupled across the amplifier to permit d.c. current to flow to the inverting node. This allows a d.c. bias to be established at the inverting input node of the operational amplifier, placing a d.c. potential at that node. However, the integration of this circuit into a monolithic integrated circuit requires a large resistor and hence requires significant silicon real estate. Further, the value of such a large resistor is difficult to control repeatably.

The alternative is to use a switched capacitor instead of a resistor in parallel with the fixed capacitor. This technique has been described in an article entitled "An Electrically Programmable Switched Capacitor Filter" by David J. Allstot, et al., IEEE J. Solid State Circuits, Vol. SC-14, pp. 1034–1041, December, 1979. FIG. 2 of the Allstot, et al. article shows a circuit using a parallel-connected switched capacitor to establish a d.c. bias voltage at the inverting input node.

The problem with these prior art circuits is that they can only be used to implement bandpass filters. They do not operate satisfactorily in the implementation of a lowpass, highpass, allpass or notch filters. When designing universal active filters to be integrated on a single silicon chip, it is far preferable to have a single design which can operate, selectively, as a lowpass, highpass, bandpass, allpass or notch filter. The filter of this invention is just such a universal filter. Furthermore, the use of the above prior art technique results in the degradation of Q and center frequency accuracy, a problem minimized in the filters of this invention.

The technique employed by this invention to overcome the above difficulties is the use of a pair of switched capacitors, one in parallel with the input section and the other in parallel with the operational amplifier, providing proper biasing whereby d.c. current can flow from through the input section of the amplifier in order to continually bring the d.c. voltage difference between the input terminals of the amplifier back to the d.c. offset voltage. The relationship of these two capacitors is fixed to obtain the desired d.c. gain from the amplifier. The circuit of the invention eliminates the need for any large external or integrated resistors. The circuit of this invention has the advantage of being able to operate at very high center frequencies, such as 100 khz, as well as frequencies as low as about 0.4 hz, while providing a high degree of d.c. gain stability over a large temperature range. The d.c. offsets at all nodes are satisfactory. The programmable universal filters of this invention can be reconfigured by a microprocessor to serve a wide variety of needs such lowpass, bandpass, allpass and notch filters.

BRIEF DESCRIPTION OF THE INVENTION

In its essentials, the self biasing filter of this invention has an input section including an operational amplifier having one output and two input terminals. A first capacitor has one of its terminals coupled to one of those input terminals and the other serves as an input node to the filter. A second capacitor is coupled between that same input terminal to the amplifier and its output terminal. The filter has a bandpass section whose input is coupled to the output of the amplifier, and a third capacitor coupled between one of the input terminals of the amplifier and the output of the bandpass section.

A lowpass section has its input coupled to the output of the bandpass section. A feedback loop is coupled between the bandpass and lowpass sections.

To achieve the necessary d.c. biasing and gain, a pair of switched capacitors is used, the first in parallel with the first capacitor and the other in parallel with the second capacitor, whereby d.c. current can flow from the input terminal of the filter to the input terminal of the operational amplifier, and from the input of the operational amplifier to the output terminal in order to bring the two terminals of the operational amplifier continually to the d.c. offset voltage of the amplifier.

A preferred embodiment of the invention employs an additional capacitor coupled between the same input of the operational amplifier and the output of the lowpass filter. In parallel with that additional capacitor is a third switched capacitor. All three switched capacitors are clocked together in order to provide the proper d.c. biasing and gain of the amplifier and to obtain a d.c. feedback path from the output of the lowpass filter to the input of the amplifier without substantially affecting the frequency response of the filter.

BRIEF DESCRIPTION OF THE DRAWINGS

The operation of these and other embodiments of the invention will be apparent from the more detailed description which follows, making reference to the drawings in which the single

DESCRIPTION OF THE PREFERRED EMBODIMENTS

Figure 1:
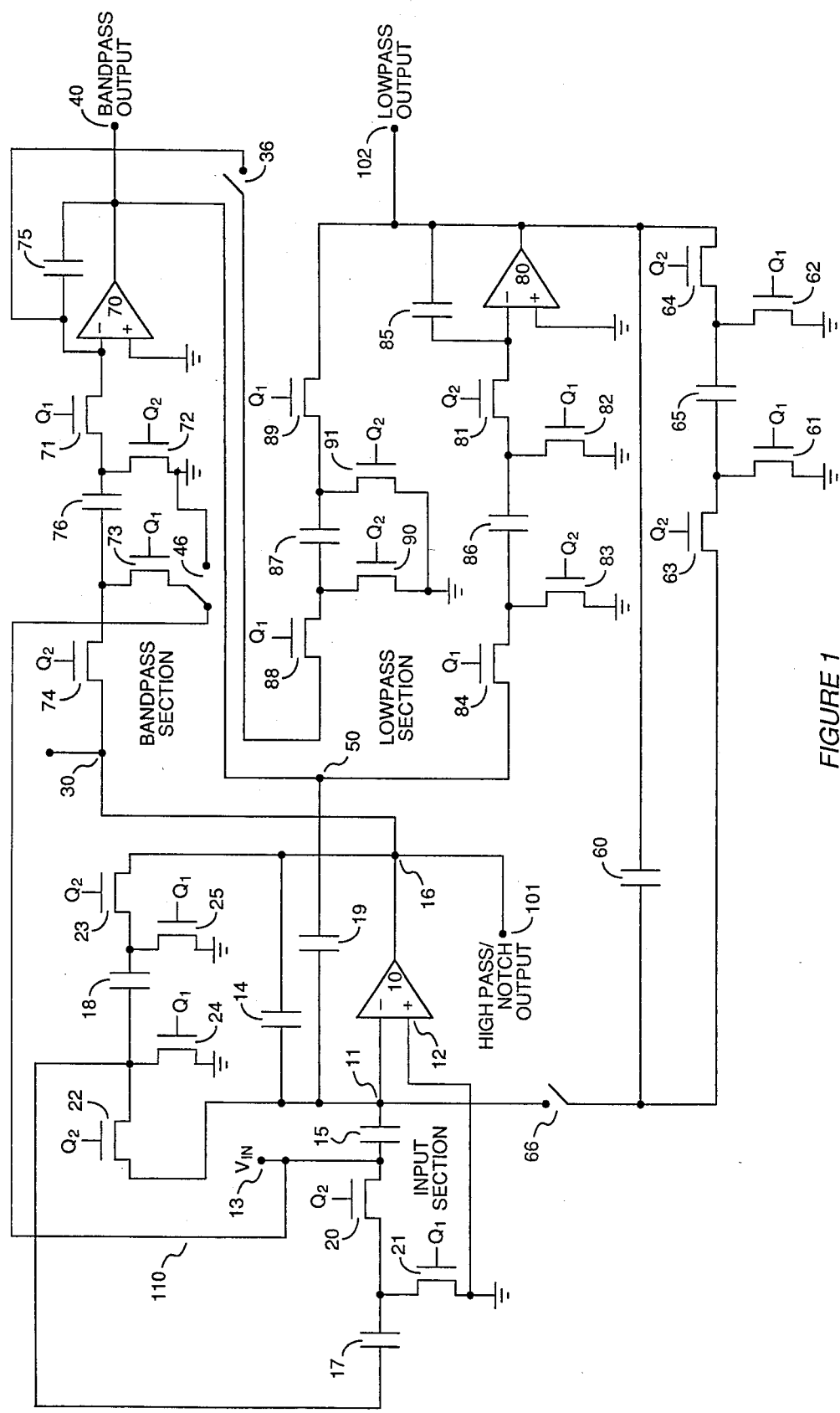
FIG. 1 is a circuit schematic of the filter of the invention.

Referring to FIG. 1, the filter of the invention has an input section which includes operational amplifier 10 having a negative input terminal 11 and positive input terminal 12 biased to a suitable potential. In the example in FIG. 1, that potential is ground. The input signal to the filter, $V_{in}$ at terminal 13, enters through capacitor 15 connected in series between input terminal 13 and input-terminal 11 of amplifier 10.

The circuit of the invention has an additional capacitor 14 used to control the gain of the amplifier 10. The a.c. gain, $V_{out/Vin}$, is $-C_{15}/C_{14}$. The d.c. gain is set by the ratio $-C_{17}/C_{18}$. In an embodiment requiring unity gain, $C_{15}=C_{14}$. Capacitor 14 is coupled between the input terminal 11 and the output terminal 16 of amplifier 10.

In order to provide a d.c. feedback path which does not substantially affect the frequency response of the filter, a pair of switched capacitors including capacitor 17 and capacitor 18, in parallel respectively with capacitors 15 and 14, are employed. The first switched capacitor 17, under clock control, periodically causes current to flow from terminal 13 to the input terminal 11 of the operational amplifier, and includes four MOS devices 20, 21, 22 and 24, operated as switches under control of the clock pulses $Q_2$, $Q_1$, $Q_2$ and $Q_1$, respectively. MOS devices 20 and 22 are connected in series with capacitor 17. One of the terminals of MOS device 21 is connected between MOS device 20 and capacitor 17. The other terminal of MOS device 21 is grounded, as shown. The other side of capacitor 17 connected to one side of both MOS devices 22 and 24.

Capacitor 18 is periodically coupled under clock control in parallel with capacitor 14. One of the source and drain terminals of MOS devices 24 and 25 is coupled respectively to each of the sides of capacitor 18 as shown in FIG. 1. The other of the source and drain terminals of these MOS devices is coupled to ground. In order to alternately ground and connect switched capacitors 17 and 18 into the circuit of FIG. 1, clock pulses $Q_1$ and $Q_2$ are out of phase with each other. When one is high, the other is low. It is important that these two clocks are separated in time so that both cannot be high at the same time. In that manner, during the period when $Q_2$ is high and $Q_1$ is low, both capacitors 17 and 18 are connected in parallel with capacitors 15 and 14, respectively. On the contrary, when $Q_2$ is low and $Q_1$ is high, both sides of both of these capacitors are connected to ground because MOS devices 21, 24 and 25 are turned on. Since both of these capacitors 17 and 18 are switched in phase with each other, being controlled by the same clocks, they are either in or out of the circuit in tandem. During the period when $Q_1$ is high and these capacitors are connected to ground, both capacitors are simultaneously fully discharged. When $Q_2$ is high, both of these capacitors are connected into the circuit and they become charged. Capacitor 18 is charged to the differential voltage across amplifier 10. Capacitor 17 is charged to the input voltage at node 13. The charge on capacitors 17 and 18 are injected into the inverting input of 11 of amplifier 10 The net effect of repeatedly charging and discharging capacitors 17 and 18 is to provide the necessary d.c. biasing and to determine the d.c. gain at nodes 16 and 102.

Amplifier 10 amplifies the voltage differential across its inputs, $V_{in}$, to produce an output voltage $V_{out}$ at node 16 equal to $V_{in}$ times the ratio of $C_{15}/C_{14}$. The switching action caused by periodically connecting capacitor 18 in and out of the circuit during the opposed cycles of clocks $Q_1$ and $Q_2$ restores the proper d.c. bias at node 11.

One of the problems that can occur in the circuit of this invention, which provides proper d.c. biasing and gain, is the possibility of creating undesireably high d.c. offset voltages at certain nodes. For example, the offset voltage at node 16 or node 102 may become excessive, limiting available signal swing through the filter. To avoid this, design precautions need to be taken to insure that excessive charge injection does not occur through capacitors 17 and 18. This is done by choosing small geometries for MOS devices 20, 21, 22 and 24 and having capacitors 17 and 18 be as large as possible. Also, the overlap capacitances of MOS devices 20, 21, 22 and 24 should be equal to each other. The overlap capacitance of an MOS device refers to the gate-to drain capacitance. These overlap capacitances feed into the respective nodes which connect these MOS devices to capacitors 17 and 18. Capacitors $C_{17}$ and $C_{18}$ must be kept small relative to $C_{14}$ so as not to affect the Q and center frequency of the filter.

The lowpass and bandpass filter sections of the invention identified in FIG. 1 comprise additional operational amplifiers, amplifier 70 in the bandpass section and amplifier 80 in the lowpass section. These sections are also controlled to operate synchronously with the input section using MO devices 71, 72, 73 and 74 in the bandpass section and MOS devices 81, 82, 83 and 84 in the lowpass section. These two filter sections operate with the same opposite clocks described above in the input section. MOS devices 71, 73, 82 and 84 are controlled by clock $Q_1$ and MOS devices 72, 74, 81 and 83 are controlled by clock $Q_2$.

Capacitors 75 and 85 integrate the charge supplied to the inverting inputs of their respective amplifiers. Capacitor 75 across amplifier 70 of the bandpass filter section serves to hold the required voltage across the amplifier, which is updated when $Q_1$ is high because MOS device 71 is turned on. The same is true of capacitor 85 in the lowpass filter section with respect to amplifier 80, except that it is updated when $Q_2$ is high when MOS device 81 is turned on. Each of these two filter sections operates as an integrator. The bandpass integrator has two input signals, the signals at nodes 16 and 102; the lowpass integrator has only one input signal at bandpass output node 40.

For one embodiment which provides a bandpass output at node 40, a lowpass output at node 102 and a notch output at node 101, the filter of the invention includes a feedback loop including capacitor 87 between the lowpass and bandpass sections. This feedback loop is connected between lowpass output 102 and the inverting input of amplifier 70, and comprises capacitor 87 and MOS devices, 88, 89, 90 and 91, controlled in synchronism with the rest of the filter by clock pulses $Q_1$ and $Q_2$, as illustrated. When clock pulse $Q_2$ turns high while $Q_1$ is low, MOS devices 90 and 91 are conducting, grounding both sides of capacitor 87. When $Q_1$ goes high when $Q_2$ is low, MOS devices 88 and 89 are conducting, thus completing the loop. This loop is connected into the circuit using MOS switch 36. For this embodiment of the invention, switch 66 must remain open. The notch location is the same as the center freguency.

MOS switches 36 and 66, as well as switch 46 whose function will be described later, are conventional MOS switches. These switches are not under clock control, as was the case for the MOS devices used in connection with the switched capacitors described earlier. MOS switches 36, 46 and 66 may be MOS devices, EPROMs or EEPROMs where the setting voltage to turn them on or off is established through the input pins of the integrated circuit or through on- chip program memory. In this manner a continuous voltage which enables or disconnects such MOS switches is continuously provided to the appropriate MOS switches in the circuit as long as that mode of operation is to be continued.

As is well known in the art, these same MOS switches can also be used to select a particular capacitance value from a bank of integrated capacitors of different values located on the chip. This provides a variety of choices of capacitances in the same circuit. In this manner, capacitors 14, 15 and 19 can be varied to determine certain parameters of the filter including selectivity and gain. The capacitance chosen for $C_{15}$, for example, determines the gain of amplifier 10.

The selectivity of the filter of the invention, commonly known as "Q", is controlled by the ratio $C_{19}/C_{14}$. For a programmable filter, the "Q" needs to be variable. This is also accomplished by employing for $C_{19}$ a bank of capacitors from which a desired capacitance value is selected using MOS switches as described above.

For a programmable filter, the center frequency needs to be under user control. Capacitor sets 76, 86, and 87, and also capacitor sets 75 and 85, are all made up of banks of capacitors having different, selectable capacitances values which also can be selected by MOS switches. In a preferred embodiment of the invention, the selected values of capacitors 76, 86 and 87 are the same; capacitors 75 and 85 are also equal to each other, but not necessarily equal to the capacitances of capacitors 76, 86 and 87. The ratio between capacitors 75 and 76, together with the choice of the clock frequency of clocks $Q_1$ and $Q_2$, control the center frequency or the cut off of frequency of the filter.

In order to provide lowpass, bandpass, and highpass outputs, the input circuit needs to be synchronized with the bandpass and lowpass filters through a feedback loop comprising capacitor 60 in parallel with a switched capacito circuit including capacitor 65 and MOS devices 61 and 62 (controlled by clock $Q_1$), and MOS devices 63 and 64 (controlled by clock $Q_2$). The required feedback is established through capacitors 60 and 65 from node 102 back to node 11. MOS switch 66 connects this synchronization circuit into the filter. For this mode of operation, switch 36 remains open and its feedback loop is unconnected.

The filter of the invention may also use both loops together, where MOS switches 36 and 66 are both closed. This results in a lowpass, bandpass or notch filter with characteristics, such as selectivity "Q" and center frequency, which are different from those found in the filter having one but not both of these loops. Using both loops, the actual notch is located at a frequency different from the center frequency of the filter.

As discussed above, the filter of the invention can be programmed to provide either a highpass or notch output at node 101. If a highpass output is required at node 101, the feedback loop containing capacitor 60 is switched into the circuit by closing MOS switch 66. The feedback loop between lowpass output node 102 and the inverting input to amplifier 70 in the bandpass section is disconnected (MOS switch 36 is open). If a notch output is desired from node 101, on the other hand, the loop between node 102 and amplifier 70 is connected into the circuit (switch 36 is closed) and the loop between node 102 and input node 11 of amplifier 20 may either be connected or disconnected using switch 66 depending on the desired notch location, Q and center frequency.

The circuit of this invention can also provide an allpass output at node 101. This requires an additional feedback loop 110 between the input of the filter at node 13 and the inverting input of amplifier 70 in the bandpass section. This feedback loop is connected through MOS device 73, capacitor 76 and MOS device 71, as shown. Feedback loop 110 may be connected into the circuit, for example, using double pole, single throw MOS switch 46. This switch changes the connection of one side of MOS device 73 from ground to loop 110, as shown. When clock pulse $Q_2$ turns high while $Q_1$ is low, MOS device 72 is conducting, grounding one side of capacitor 76. When $Q_1$ goes high while $Q_2$ is low, MOS devices 71 and 73 are conducting, thus completing the loop 110 through capacitor 76 to the inverting input of amplifier 70.

For the allpass application, MOS switch 36 is closed and MOS switch 66 is open, connecting the loop containing capacitor 87 and disconnecting the loop containing capacitor 60. The allpass output of the circuit is at node 101. In this embodiment, however, only an allpass output is possible at node 101, not a notch or highpass output.

All MOS devices used in the invention may be either P-channel or N-channel. The logic illustrated dictates the use of N-channel devices. However, CMOS is the preferred technology for the filters of the invention. Using CMOS, each illustrated MOS device becomes two devices, one N-channel and one P-channel, connected in parallel as is well known in the art, with the normal clock input connected to the gate of one MOS device and its complement connected to the other.

While the invention has been described in several preferred embodiments, those skilled in the art will see that many modifications may be made to the embodiments shown without departing from the spirit and scope of the invention claimed in the claims which follow.

I claim:

1. A self-biasing programmable, univeral active filter comprising:

an input section including an operational amplifier having one output and two input terminals, a first capacitor having one terminal coupled to one of said input terminals and the other terminal serving as an input node to the filter, and a second capacitor coupled between said one input terminal and said output terminal;

a bandpass section having an input coupled to the output terminal of said amplifier and having an output;

a third capacitor coupled between said one input terminal of said amplifier and the output of said bandpass section;

a lowpass section having an input coupled to the output of said bandpass section and having an output; and a pair of switched capacitors under clock control, one in parallel with said first capacitor and the other in parallel with said second capacitor, the values of said pair of switched capacitors having a fixed relationship selected to determine the d.c. gain of said amplifier and filter, whereby d.c. current can flow from said input node to the filter to said one input terminal of said amplifier, and from said one input terminal of said amplfier to the output terminal of said amplifier and filter during at least a portion of the clock cycle.

2. The self-biasing programmable, universal active filter of claim 1 further characterized by the addition of a feedback means coupled between said bandpass and said lowpass sections.

3. The self-biasing, programmable, universal active filter of claim 1 further characterized by the addition of a fourth capacitor coupled between the output of said lowpass section and said one input of said operational amplifier, and a third switched capacitor in parallel with said fourth capacitor, all three switched capacitors being switched together to provide d.c. feedback paths which do not substantially affect the frequency response of the filter.

4. The self-biasing programmable, universal active filter of claim 3 further characterized by the addition of a feedback means coupled between said bandpass and said lowpass sections.

5. The self-biasing programmable, universal active filter of claim 2 further characterized by said bandpass section comprising a second operational amplifier having two input terminals and an output terminal, and having a bandpass input section coupled to one of said input terminals, said bandpass input section including a switched capacitor.

6. The self-biasing programmable, universal active filter of claim 5 further characterized by the addition of a means connecting the input node to said filter to said bandpass input section, and a means for providing an allpass output at the output of the operational amplifier in the input section of the filter.

7. The self-biasing programmable, universal active filter of claim 1 further characterized by said bandpass and lowpass sections each including an additional operational amplifier having two input terminals and each including an input section coupled to one of the input terminals of said operational amplifier, said input section comprising a switched capacitor which is switched into and out of the circuit in synchronism with the clocks controlling the other switched capacitors in the filter.

* * * * *

UNITED STATES PATENT AND TRADEMARK OFFICE
CERTIFICATE OF CORRECTION

PATENT NO. : 4,801,888
DATED : 01/31/89
INVENTOR(S) : Hague

It is certified that error appears in the above-identified patent and that said Letters Patent is hereby corrected as shown below:

| COLUMN | LINE | DESCRIPTION |
| --- | --- | --- |
| 04 | 49 | delete "MO" insert --MOS-- |
| 05 | 17-18 | delete "frequency" insert --frequency-- |
| 05 | 65 | delete "capacito" insert --capacitor-- |

Signed and Sealed this

Twenty-fourth Day of October, 1989

Attest:

DONALD J. QUIGG

*Attesting Officer*   *Commissioner of Patents and Trademarks*